United States Patent [19]

Mooney et al.

[11] Patent Number: 4,916,088

[45] Date of Patent: Apr. 10, 1990

[54] METHOD OF MAKING A LOW DISLOCATION DENSITY SEMICONDUCTOR DEVICE

[75] Inventors: John B. Mooney, San Jose; Arden Sher, San Carlos, both of Calif.

[73] Assignee: SRI International, Menlo Park, Calif.

[21] Appl. No.: 187,939

[22] Filed: Apr. 29, 1988

[51] Int. Cl.$^4$ ............................................. H01L 21/20
[52] U.S. Cl. .............................. 437/81; 148/DIG. 15; 148/DIG. 40; 148/DIG. 72; 148/DIG. 97; 156/610; 437/18; 437/133; 437/132; 437/173; 437/936; 437/959; 437/976; 437/987
[58] Field of Search ................... 148/DIG. 15, 40, 41, 148/48, 56, 65, 64, 71, 72, 97, 94, 110, 113, 169; 427/35, 38, 39, 53.1, 54.1, 55; 156/610–615; 556/1, 70; 437/18, 19, 81, 82, 85, 105, 107, 126, 133, 165, 173, 936, 937, 942, 959, 963, 976, 987

[56] References Cited

U.S. PATENT DOCUMENTS

| | | | |
|---|---|---|---|
| 3,492,175 | 1/1970 | Conrad et al. | 437/81 |
| 4,255,211 | 3/1981 | Fraas | 136/249 |
| 4,568,792 | 2/1986 | Mooney et al. | 136/260 |
| 4,611,388 | 9/1986 | Pande | 437/133 |
| 4,659,401 | 4/1987 | Reif et al. | 437/105 |
| 4,697,202 | 9/1987 | Sher | 357/63 |
| 4,734,514 | 3/1988 | Melas et al. | 556/70 |
| 4,740,606 | 4/1988 | Melas | 556/1 |

FOREIGN PATENT DOCUMENTS 0246785 11/1987 European Pat. Off. .
0006071 10/1986 PCT Int'l Appl. .

OTHER PUBLICATIONS

Barnett et al., "A Review of Recent Results on Single Crystal Metastable Semiconductors: Crystal Growth, Phase Stability and Physical Properties," Materials Research Society Symposia Proceeding, vol. 37, (1985).
Stutius, "Growth and Doping of ZnS . . . by Organometallic Chemical Vapor Deposition", J. Cryst. Growth, vol. 56, 1982, pp. 1–9.
Bass et al., "MOCVD of Indium Phosphide . . . Trimethylamine Adducts", J. Cryst. Growth, vol. 75, 1986, pp. 221–226.

*Primary Examiner*—Brian E. Hearn
*Assistant Examiner*—William Bunch
*Attorney, Agent, or Firm*—Lowe, Price, LeBlanc, Becker & Shur

[57] ABSTRACT

A low dislocation density semiconductor device includes a first semiconductor layer of a III-V or II-VI semiconductor compound and alloying atoms on a nonmetal substrate. The semiconductor compound usually has a large dislocation density. A predetermined position of the alloying atoms in the compound lattice structure can substantially reduce the compound dislocation density. Energy is applied to the alloying atoms so they are at the predetermined positions. The number of alloying atoms causes the semiconductor compound solubility limit to be exceeded. The layer is formed on a substrate of the III-V or II-VI semiconductor, such as gallium arsenide or another semiconductor, such as silicon or on an insulator such as sapphire. In the latter cases, the layer is formed on an intermediate layer having a lattice constant between that of the substrate and semiconductor compound. A second layer is epitaxially deposited on the first layer so both layers have virtually the same lattice constant and dislocation density. The alloying atoms are deposited by different energy assist methods, e.g. by an ion beam that irradiates the substrate, or by an energy assisted organometallic chemical vapor deposition process. The energy assist can be by ionization or optical irradiation causing topical heating of surface atoms deposited by the OMCVD process, without heating of the substrate or the underlying atoms. If the ion beam process is employed, the substrate is annealed such that the alloying atoms move from initial random locations thereof in the compound lattice to the predetermined locations.

71 Claims, 2 Drawing Sheets

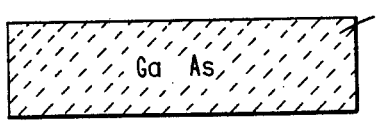
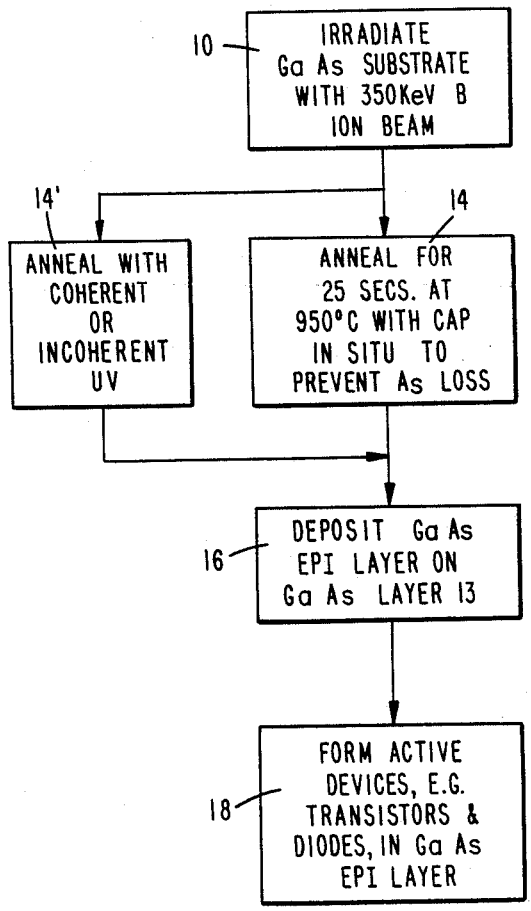
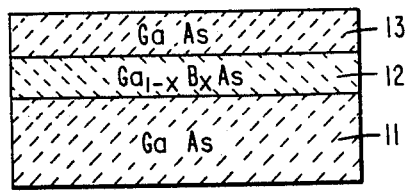
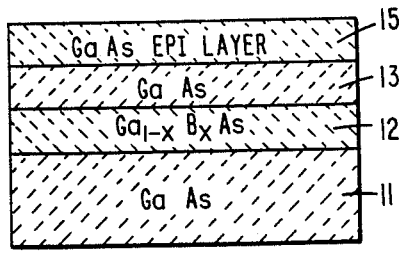
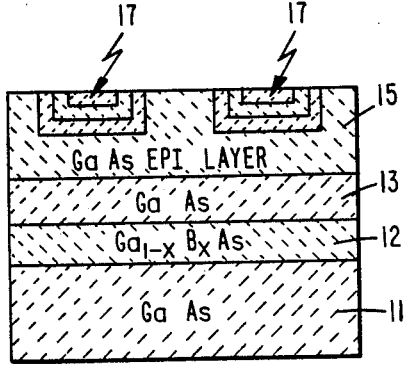

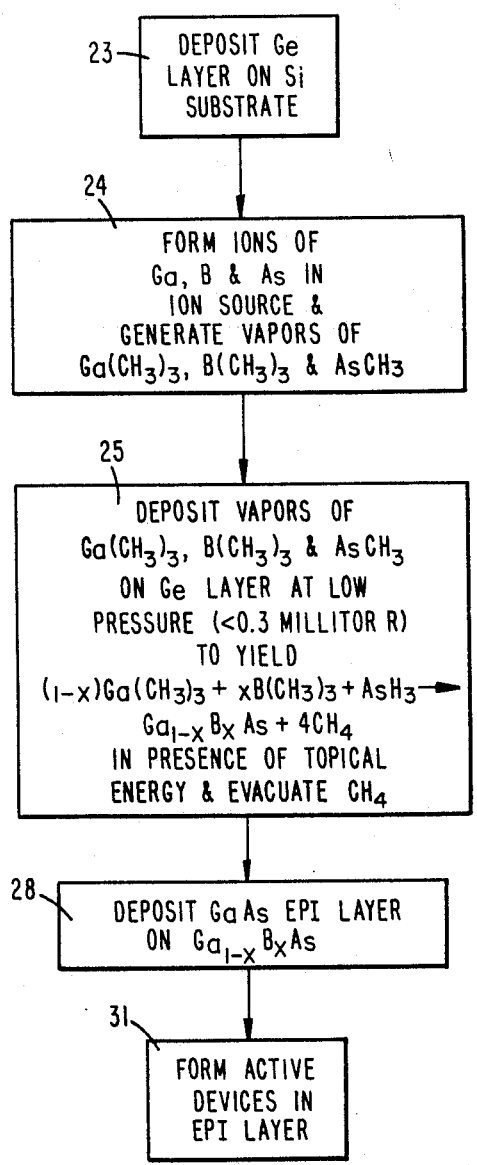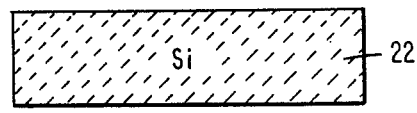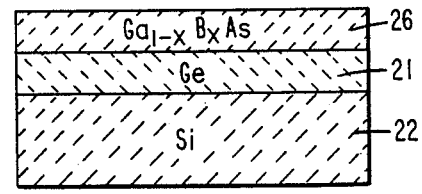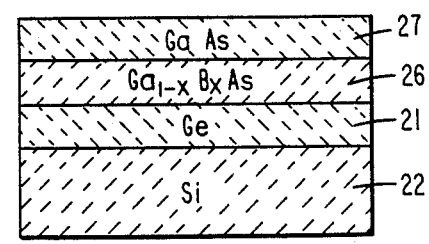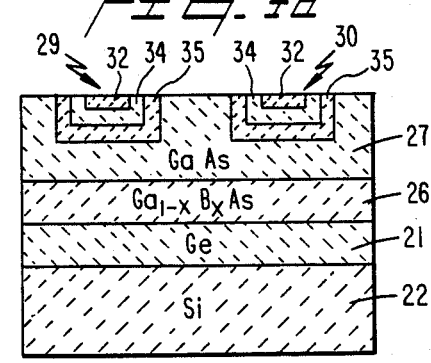

METHOD OF MAKING A LOW DISLOCATION DENSITY SEMICONDUCTOR DEVICE

FIELD OF INVENTION

The present invention relates generally to low dislocation density semiconductor devices and methods of forming same and more particularly to a method of forming low dislocation density semiconductor devices wherein low dislocation density is achieved by: (1) ion beam bombardment of a high dislocation bulk substrate with ions of alloying atoms that reduce the substrate dislocation density and to an article formed thereby, and (2) performing an organometallic chemical vapor deposition process of materials that form a low dislocation density layer. In accordance with a further aspect of the invention, a substrate includes a first layer of a normally high dislocation density semiconductor compound and alloying atoms located in the semiconductor compound lattice structure to reduce dislocation density of the semiconductor compound, in combination with an epitaxial layer of the compound.

BACKGROUND ART

It is known that dislocation density of semiconductor compounds of columns III-V and II-VI of the periodic chart can be reduced by proper introduction of alloying atoms into the compounds. In Sher U.S. Pat. No. 4,697,202 and Mooney et al U.S. Pat. No. 4,568,795 it is indicated that the dislocation density of III-V and II-VI semiconductor compounds can be reduced by alloying such semiconductors with isoelectronic impurity atoms forming bond lengths with the semiconductor atoms that are less than the bond lengths between the atoms of the semiconductor. It is also known to add indium as an isoelectronic impurity for gallium arsenide dislocation density reduction. The indium is added to a melt during gallium arsenide crystal growth. The indium-arsenide bond is longer than that of the gallium arsenide whereby indium alloying of gallium arsenide is apparently by a mechanism different from that relied on in the aforementioned patents. The present invention is applicable to both long and short bond length alloying atoms.

The conventional method of growing semiconductors having dislocation density reducing alloying atoms in 10 the semiconductor structure is by melt techniques, such as modified Bridgeman and Czochralski techniques. These prior art techniques generally limit the number of the alloying atoms to relatively low values such that the solubility limit of the host semiconductor compound cannot be exceeded. This value is insufficient to eliminate dislocations totally. For example, these conventional melt techniques are generally able to introduce a maximum of about 0.09 atom percent boron into gallium arsenide, to form $Ga_{0.9991}B_{0.0009}As$. In the conventional methods, for boron concentrations in GaAs above 0.09 atom percent solubility limit, constitutional super cooling leads to striations and eventually polycrystallinity. It was found that in the region between striations dislocation density was relatively low. While the 0.09 atomic percent introduction of boron results in a significant dislocation density reduction, greater dislocation density reduction can be achieved with larger percentages of boron in gallium arsenide. The same is true for other alloying atoms that reduce semiconductor compound dislocation density. It would be desirable to introduce a number of alloying atoms such that the semiconductor compound is in a metastable state, exceeding the solubility limit thereof, and the alloying atoms are in a super-saturated state in the semiconductor compound. For example, it would be desirable to alloy gallium arsenide with boron so that there is a 5 atomic percent introduction of boron into the gallium, to produce $Ga_{0.95}B_{0.05}As$.

Reduction and elimination of dislocations in gallium arsenide have been sought for many years. If the high dislocation density inherent in gallium arsenide could be materially reduced over large volumes, the known advantages of gallium arsenide relating to high speed operation and radiation withstanding properties could finally be achieved. Hence, it is highly desirable to provide a virtually dislocation-free gallium arsenide carrier for active semiconductor devices, a result which could be achieved by introducing an epitaxial layer of gallium arsenide super-saturated with boron or nitrogen on a conventional substrate, e.g., of bulk gallium arsenide, silicon or sapphire. If the boron or nitrogen concentration in the gallium arsenide is supersaturated, the energy per unit length for dislocation formation arising mostly from long range shear strains increases in the presence of the short bond length induced increase of the elastic constants of the introduced boron or nitrogen atoms, to prevent dislocations from propagating from the substrate into the epitaxial layer. A problem, however, in introducing boron or nitrogen to a super-saturated concentration, is that the alloying atoms may affect the electric characteristics of the semiconductor devices formed in the epitaxial layer containing the alloying atoms. To obviate this problem, it is desirable to form a GaAs epitaxial layer on the epitaxial layer containing the alloying atoms. Also, great care must be exercised in depositing layers with supersaturated concentrations of the alloying atoms because of the great tendency for the alloying atoms to precipitate from the GaAs lattice structure into a conglomerated mass (inclusions).

It is, accordingly, an object of the present invention to provide a new and improved method of forming low dislocation density semiconductor devices and to the devices produced by such methods.

Another object of the invention is to provide a new and improved method of forming low dislocation density semiconductor devices wherein the device is alloyed with atoms that reduce dislocations in the semiconductor device.

Another object of the invention is to provide a new and improved method of forming low dislocation density devices wherein dislocation removing alloying atoms are above the solubility limit of a semiconductor compound.

Another object of the invention is to provide a new and improved method of alloying boron or nitrogen into gallium arsenide to an extent that the boron or nitrogen exceeds the solubility limit of the gallium arsenide and is supersaturated therein.

THE INVENTION

In the present invention, a low dislocation density semiconductor device is formed by forming a semiconductor layer consisting essentially of a III-V or II-VI semiconductor compound and alloying atoms on a non-metal substrate. The III-V or II-VI semiconductor compound, when formed as a layer on the substrate, usually has a relatively large dislocation density for one reason or another. For example, the substrate may have a high dislocation density (as in the case of gallium arsenide) resulting in the layer usually having a similar large dislocation density, or the formed layer may have a lattice constant materially different from the lattice constant of the substrate or an underlying layer, resulting in strains in the layer that lead to high dislocation density substrate. The alloying atoms are of a type such that a predetermined position of atoms thereof in the III-V or II-VI semiconductor compound lattice can substantially reduce the dislocation density of the III-V or II-VI semiconductor compound layer. Such alloying atoms are of the type disclosed in the aforementioned Sher and Mooney et al patents or by the introduction of indium, as discussed supra.

In accordance with one aspect of the invention, energy is applied to the alloying atoms such that they are at the predetermined positions thereof in the lattice. Preferably, the number of alloy atoms is such &hat the semiconductor is in approximately a metastable state, i.e., above the solubility limit of the semiconductor compound such that the alloying atoms are supersaturated in the III-V or II-VI semiconductor compound.

In one embodiment of the invention, the alloying atoms are deposited in the substrate by an ion beam having sufficient energy to cause ions in the beam to be deposited at random positions in the substrate lattice structure, several atomic layers below the substrate surface. The substrate is then flash annealed causing the alloying atoms to move from the initial random locations thereof to the predetermined locations in the lattice where dislocation density is substantially reduced, without precipitating the alloying atoms.

It has been found, through actual experimentation, that irradiating a gallium arsenide bulk substrate with boron atoms causes formation of a low dislocation density $Ga_{1-x}B_xAs$ layer if the substrate is flash annealed at a temperature of about 950° C. for about 25 seconds. The resulting structure thus includes a bulk substrate consisting essentially of gallium arsenide in which is buried a $Ga_{1-x}B_xAs$ low dislocation density layer having a thickness of a few thousand atomic layers over which subsists a low dislocation GaAs layer having a thickness of several thousand atomic layers. An epitaxial GaAs layer is then grown on the GaAs layer having a thickness of several thousand atomic layers. Electronic semiconductor devices are formed in the grown low dislocation GaAs layer. Alternatively, a super lattice structure is grown on the low dislocation density GaAs layer having a thickness of several hundred to several thousand atomic layers.

In a second embodiment, the alloying atoms and III-V or II-VI semiconductor compound are deposited using low energy organometallic chemical vapor deposition techniques. The alloying atoms and semiconductor atoms are carried in first and second molecules containing organic ions. The molecules react on the substrate to form the low dislocation density alloyed layer. For example, to form $Ga_{1-x}B_xAs$ and $GaN_yAs_{1-y}$ layers, the following reactions occur:

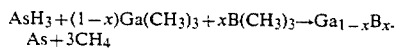

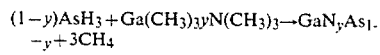

where $0 < x < 0.3$, $0 < y < 0.3$; preferably $0.01 < x < 0.05$ and $0.005 < y < 0.05$ to assure achieving boron and nitrogen supersaturation while avoiding precipitation.

To enable boron to be alloyed into the gallium arsenide at or above the gallium arsenide solubility limit energy is topically added to $Ga_{1-x}B_xAs$ or $GaN_yAs_{1-y}$ as they are deposited on the substrate by the reaction. The topically added energy can be in the form of low energy ions of the molecules involved in the reaction as derived from a cyclotron resonance device, or ions extracted from a microwave plasma by biasing the substrate, or photon (preferably ultraviolet) irradiation of the substrate. The added energy causes the alloying atoms in the upper few deposited atomic layers to be at the correct lattice sites to reduce dislocation density, without causing precipitation of the alloying atoms even though they are supersaturated in the GaAs molecules. The added energy increases the mobility of the alloying B atoms at the surface where the chemical reaction takes place enabling the B atoms to be supersaturated in the lattice at sites corresponding with Ga atoms; in the case of N atoms being alloyed with GaAs, the N atoms a resupersaturated in the lattice at sites corresponding with As atoms.

The organometallic chemical vapor deposition (OMCVD) process is advantageous because it obviates the need to add alloying atoms to a substrate or a formed layer. Because of the OMCVD process boron or nitrogen atoms are deposited in the gallium arsenide lattices during formation at the location where dislocation density is minimized. This is true whether the $Ga_{1-x}B_xAs$ or $GaN_yAs_{1-y}$ layer is deposited on a GaAs substrate or on some other substrate, such as a silicon substrate on which is formed a lattice matching buffer layer of e.g., Ge, or a graded SiGe layer. The lattice matching layer is formed on a silicon layer prior to deposition of a $Ga_{1-x}B_xAs$ or $GaN_yAs_{1-y}$ layer because there is a lattice mismatch between $Ga_{1-x}B_xAs$ or $GaN_yAs_{1-y}$ and Si such that the desired dislocation density in the $Ga_{1-x}B_xAs$, $GaN_yAs_{1-y}$ and GaAs layers may not otherwise be achieved.

The OMCVD process is applicable to other hydrocarbons to produce other III-V or II-VI semiconductors with supersaturated dislocation density reducing alloying atoms. For example, to form a $Ga_{1-x}B_xAs$ or a $GaN_yAs_{1-y}$ layer, where $0 < x < 0.3$ and $0 < y < 0.3$ (preferably $0.01 < x < 0.05$ and $0.005 < y < 0.05$), the following reactions are performed in a low pressure reaction vessel on a layer of a suitable substrate in the presence of a topical energy assist step:

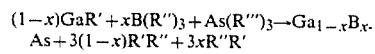

or

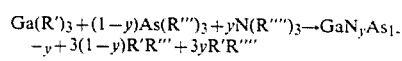

where R' and R'''' are any hydrocarbon groups of the alkyl family $C_nH_{2n-1}$, R''' is H or any hydrocarbon groups of the alkyl family $C_nH_{2n-1}$, and n is 1, 2, 3, 4 . . . (usually less than 5).

When the low energy ionization source is used to produce the ions for the organometallic molecules the chemistry remains the same as in conventional processes, but the added energy of ionization and the accelerating field assist in the epitaxy process and aid in introducing the boron or nitrogen into a metastable solution. The organometallic chemical vapor deposition process enables substrate temperatures to be relatively low, a particular advantage when $Ga_{1-x}B_xAs$ is deposited on a germanium lattice matching layer deposited on a silicon substrate. Low temperatures are desirable in such processes because of the substantial differences of the temperature coefficients of expansion and thermal conductivities of $Ga_{1-x}B_xAs$, Ge and Si. The high temperatures involved in annealing an ion implanted $Ga_{1-x}B_xAs$ layer are obviated through the use of the organometallic chemical vapor deposition (OMCVD) process. The OMCVD process also avoids the need for extreme control of temperature and magnetic fields during growth. It reduces the fragility introduced by conventional indium alloying of GaAs, which have limited the size and availability of gallium arsenide for substrates.

Photon energy, particularly in the form of coherent or incoherent ultraviolet energy, can be used for annealing after high energy ion beam irradiation, or to irradiate the substrate at the time a chemical vapor deposition process is in progress, as described supra.

BRIEF DESCRIPTION OF THE DRAWING

FIG. 1 is a flow diagram in accordance with the present invention wherein boron is implanted in gallium arsenide and annealed to form a low dislocation density $Ga_{1-x}B_xAs$ layer;

FIGS. 2a-2d are schematic side views of an electronic semiconductor device formed in accordance with the method of FIG. 1, at various stages in the construction of the device;

FIG. 3 is a flow diagram of a second embodiment of the invention wherein an electronic device is formed on an epitaxial $Ga_{1-x}B_xAs$ layer on a silicon substrate; and FIGS. 4a-4e are schematic side views of the device formed in accordance with the method of FIG. 3, at various stages in the construction of the device.

DESCRIPTION OF PREFERRED EMBODIMENTS

Reference is now made to FIGS. 1 and 2a-2d of the drawing wherein a gallium arsenide bulk substrate 11 having the usual relatively high dislocation density is irradiated during step 10 with an ion beam having an energy level of 350 kiloelectron volts and containing doubly ionized boron (B++). In the preferred embodiment, the boron ions irradiate substrate 11 until boron atoms in the substrate reach a density in the range of $2 \times 10^{19}$ to about $6.5 \times 10^{21}$ atoms per cubic centimeter of GaAs, although the preferred range is from about $10^{20}$ to $10^{21}$ atoms of boron per cubic centimeter of GaAs. The stated maximum range enables the boron to be supersaturated and precludes boron precipitation. The preferred range more positively provides these factors.

The boron ions have sufficient energy to penetrate the top several thousand atomic layers of gallium arsenide substrate 11 so that after approximately one half hour of ion bombardment, there is formed isoelectronic layer 12 containing gallium, boron and arsenic. Layer 12 is buried below layer 13 containing only gallium and arsenic. Layer 12 has a thickness of between ½ and 1 micron, i.e., a thickness of about 2,000 atomic layers. Layer 13 has a thickness of between ¼ and ½ micron, i.e. a thickness of 500 to 1,000 atomic layers.

The boron atoms in layer 12 are initially at random positions in the gallium arsenide of substrate 11. The low dislocation density effects of boron in gallium arsenide, as discussed in the aforementioned Sher patent, are attained by locating boron atoms at the correct, predetermined position as the lattice structure of layer 12 is recrystallized. To these ends, substrate 11, including layers 12 and 13, is flash annealed, as illustrated in steps 14 or 14'. A $Si_3N_4$ cap is placed above layer 13 during annealing. Rapid or flash annealing also helps to minimize arsenic out gassing from substrate 12 and enables the solubility limit of the boron vis-a-vis gallium arsenide to be exceeded to assist in minimizing dislocation density in layers 12 and 13.

During the flash annealing step, the boron atoms in layer 12 move in layer 12 to the correct positions in the gallium arsenide lattice thereof, to form $Ga_{1-x}B_xAs$ having the desired low dislocation density, where $0 < x < 0.3$ and preferably $0.01 < x < 0.05$. Layers 12 and 13 have nearly the same lattice constant and dislocation density. Flash annealing is important to prevent precipitation of boron from layer 12; in other words, flash annealing prevents the boron atoms in layer 12 from conglomerating. By flash annealing the B atoms do not have time for agglomeration but enough energy is provided for recrystallization of boron atoms in gallium lattice sites. If the boron atoms precipitate they are not at the correct lattice sites in the gallium arsenide matrix and the desired effects discussed in the Sher patent are not achieved.

In experiments actually conducted using quartz iodide infrared lamps, it was found that flash annealing for 25 seconds at 950° C., provided the greatest dislocation density reduction of layers 12 and 13 relative to that of substrate 11. If the annealing temperature is appreciably higher than 950° C., arsenic atoms boil off substrate 11 and thereby adversely affect the properties of the substrate. It has been found that if annealing is at temperatures less than 950° C. the low dislocation density attained with the 950° C. annealing does not occur.

Annealing can also be accomplished by irradiating the top atomic layers of substrate 11 containing layers 12 and 13 with ultraviolet photon energy derived from a coherent or incoherent source, i.e., from an ultraviolet laser or from an ultraviolet lamp, as indicated by step 14'. The annealing of step 14' desirably produces the same results as discussed for step 14, i.e., providing sufficient mobility to the boron atoms to locate them properly in the gallium arsenide lattice to minimize dislocation density in layers 12 and 13, without causing the boron to precipitate.

After low dislocation density layers 12 and 13 have been formed on gallium arsenide substrate 11, the thickness of low dislocation density layer 13 may be increased to enable active semiconductor devices to be formed on the low dislocation density structure. This is because layer 13 has a thickness of only ½ to ¼ micron. To these ends, using conventional growth techniques, gallium arsenide epitaxial layer 15 is deposited on layer 13 to a thickness sufficient to accommodate active semiconductor devices, such as bipolar transistors 17 that are formed in layer 15 during step 18. Because of the low dislocation density of the gallium arsenide layer containing the active electronic devices and the high electron mobility thereof, the active devices have uniform reproducible characteristics and are capable of very high speed operation.

Reference is now made to FIG. 3 and 4 of the drawing wherein there are respectively illustrated organometallic chemical vapor deposition steps for forming a device containing a low dislocation density gallium arsenide epitaxial layer 27 with high speed, active devices therein, and the device in intermediate and final forms. Gallium arsenide layer 27 is formed as an epitaxial layer on low dislocation density $Ga_{1-x}B_xAs$ layer 26, in turn formed on germanium layer 21 deposited on bulk silicon substrate 22, where x may have a value between 0.0009 and 0.3 and preferably has a value in the range of about 0.01 to 0.05; at all of these values the boron is super-saturated in the GaAs. Germanium layer 21 is deposited on silicon substrate 22 as an intermediate layer between $Ga_{1-x}B_xAs$ layer 24 and the silicon substrate to provide an approximate lattice match for the $Ga_{1-x}B_xAs$ layer. The lattice constants of $Ga_{1-x}B_xAs$ and silicon differ enough from each other such that a low dislocation density $Ga_{1-x}B_xAs$ layer may not be formed as easily on a silicon substrate without the use of the intermediate Ge layer; Ge has a lattice constant of 5.658, Si has a lattice constant of 5.431 and GaAs has a lattice constant of 5.654. Since x is preferably between 0.01 and 0.05 the lattice constant of $Ga_{1-x}B_xAs$ is about the same as Ge to promote a low dislocation density of $Ga_{1-x}B_xAs$ layer 24.

To these ends, germanium layer 21 is deposited on silicon substrate 22 during conventional deposition step 23. Then ions of Ga, B and As are formed in an ion source and vapors of $Ga(CH_3)_3$, $B(CH_3)_3$ and $AsCH_3$ are formed during step 24 and deposited during step 25 as $Ga_{1-x}B_xAs$ layer 26. $Ga_{1-x}B_xAs$ layer 26 is formed on Ge layer 21 in a low-pressure (not more than 0.3 torr) vacuum chamber using an energy assist low-pressure organometallic chemical vapor deposition (OMCVD) process according to the invention. The energy assist can be a low energy ion or photon assisted OMCVD process. The low energy ion assisted OMCVD process can be of the cyclotron resonance type, as disclosed by Yamada et al, *Applied Physics Letters*, Vol. 50, No. 7, Feb. 16, 1987, pp. 386–388 wherein a substrate is supplied with a bias voltage causing ions of gallium, boron and arsenic compounds to be simultaneously incident thereon while un-ionized vaporized molecules of $Ga(CH_3)_3$, $B(CH_3)_3$ and $AsH_3$ are deposited on the germanium layer. During the deposition process, the following chemical reaction occurs:

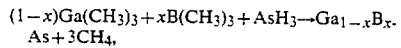

$(1-x)Ga(CH_3)_3 + xB(CH_3)_3 + AsH_3 \rightarrow Ga_{1-x}B_x As + 3CH_4$, where $0<x<0.3$; preferably $0.01<x<0.05$. The reaction occurs between un-ionized and ionized molecules of $Ga(CH_3)_3$, $B(CH_3)_3$ and $AsH_3$. The ionized molecules, typically having energies between 50 and 300 eV as a result of the substrate bias, add sufficient energy to the atoms involved in the reaction at any time instant to increase the mobility thereof to achieve the supersaturated low dislocation density structure. The added energy is not sufficient, however, to affect the lattice structure of previously deposited and formed atomic layers of $Ga_{1-x}B_xAs$, Ge layer 21 or substrate 22. Therefore, the added energy only topically affects the $Ga_{1-x}B_xAs$ molecules and does not cause B atoms in the top or underlying previously deposited $Ga_{1-x}B_xAs$ atomic layers to precipitate out of the supersaturated state.

Other mechanisms can be used to topically add energy to $Ga(CH_3)_3$, $B(CH_3)_3$ and $AsH_3$ molecules during the chemical vapor deposition process to achieve the required B mobility to achieve a supersaturated B state, without B precipitation. For example, ions can be extracted from a microwave plasma by biasing a substrate in the vicinity of a source of such a plasma while vapors of $Ga(CH_3)_3$, $B(CH_3)_3$ and $AsH_3$ are directed at a surface on the substrate. The extracted ions are incident on the substrate surface with sufficient energy to increase the mobility of molecules involved in the reaction to cause B to be at the correct lattice sites to achieve reduced dislocation density. The ion energy must be sufficiently low to preclude heating of previously deposited, underlying $Ga_{1-x}B_xAs$ atomic layers, Ge layer 21 and substrate 22 to prevent B precipitation. Another alternative involves photon irradiating a surface on the substrate while the $Ga(CH_3)_3$, $B(CH_3)_3$ and $AsH_3$ molecules are incident on the surface. Preferably, the photons are in an optical ultraviolet coherent or incoherent beam that scans or blankets the surface. Ultraviolet energy is preferred because it has the energy level necessary to cause the B atoms to have the required mobility to assume the correct lattice site while preventing precipitation.

Methane ($CH_4$) formed during the reaction is evacuated from the low pressure reaction chamber. The mole values of the deposited vapors are adjusted such that x is in the above range so that layer 26 is supersaturated with boron to achieve the desired low dislocation density for layer 26.

Next, GaAs epitaxial layer 27 is formed on $Ga_{1-x}B_xAs$ layer 26 during step 28. GaAs layer 27 is formed using conventional crystal grown techniques, or by using an ion-assisted low-pressure organometallic chemical vapor process. GaAs layer 27 is deposited on $Ga_{1-x}B_xAs$ layer 26 because active electronic semiconductor devices have better performance characteristics in GaAs layer 27 than in $Ga_{1-x}B_xAs$ layer 26. If an ion-assisted organometallic chemical vapor deposition process is used for GaAs layer 27, such a deposition process is also performed in a low pressure reaction chamber at a pressure of less than 0.3 millitorr by forming ions simultaneously in one or more ion sources to generate at least partially ionized vapors of $Ga(CH_3)_3$ and $AsH_3$. The reaction is:

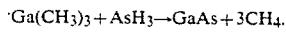

$Ga(CH_3)_3 + AsH_3 \rightarrow GaAs + 3CH_4$.

Again, methane produced by the reaction is evacuated from the reaction chamber. Then, active circuit elements are deposited in GaAs layer 27 using conventional diffusion or implantation techniques. In particular, bipolar transistor devices 29 and 30 are formed during step 31 by diffusing p and n type dopants into layer 27 to form emitters 32, bases 34 and collectors 35. Other types of active devices, such as field effect devices can be formed in layer 27. Appropriate connections between the various active devices are formed using conventional techniques to form desired circuit configurations.

To reduce dislocation density further in a gallium arsenide layer containing the active devices, a super-lattice structure of alternate $Ga_{1-x}B_xAs$ and GaAs layers is formed such that there are multiple sets of alternating $Ga_{1-x}B_xAs$ and GaAs layers. The alternate layers of $Ga_{1-x}B_xAs$ and GaAs provide strain layers to virtually terminate dislocations. The alternate $Ga_{1-x}B_xAs$ and GaAs super lattice layers are preferably deposited utilizing the previously described ion assisted organometallic chemical vapor deposition process.

To reduce dislocation density further in $Ga_{1-x}B_xAs$ layer 27, layer 21 is formed as a graded $Si_yGe_{1-y}$ layer, where y varies from slightly more than 0 to 1; the values of y approximating 1 are on and adjacent silicon substrate 22 while the values of y close to 0 are at or in very close proximity with $Ga_{1-x}B_xAs$ layer 26. The graded $Si_yGe_{1-y}$ layer is formed in the usual manner by varying percentages of silicon and germanium during the deposition process for the $Si_yGe_{1-y}$ layer. While a lattice mismatch occurs all the way through the graded $Si_yGe_{1-y}$ layer, at the Gerich rich side of the graded layer there are fewer dislocations than if a pure germanium layer having the same thickness were deposited on silicon substrate 22. Because of the fewer dislocations in the graded $Si_yGe_{1-y}$ layer at the Ge-rich side, there are fewer dislocations in the $Ga_{1-x}B_xAs$ layer at its interface with the graded layer and fewer dislocations in the GaAs layer. By using the $Ga_{1-x}B_xAs$/GaAs super-lattice technique, dislocation density in the GaAs layer containing the active semiconductor devices is virtually zero.

Alternative structures having low dislocation density layers containing active devices can be deposited on various substrates of, e.g., gallium arsenide, silicon or sapphire ($Al_2O_3$). Intermediate layers containing alloying atoms formulated as $Ga_{1-x}B_xAs$ or $GaN_zAs_{1-z}$ or intermediate layers of Ge or graded $Si_yGe_{1-y}$ and $Ga_{1-x}B_xAs$ layers can be employed. A summary of the preferred substrates, preferred intermediate layers and preferred final layers is:

(1) GaAs/$Ga_{1-x}B_xAs$/GaAs, where x is a fixed value in the range from 0.01 to 0.05 (in this notation GaAs is the substrate, $Ga_{1-x}B_xAs$ is the intermediate layer and GaAs is the device containing layer), (2) Si/$Ga_{1-x}B_xAs$/GaAs, where x is a fixed value between 0.01 and 0.05, (in this notation Si is the substrate, $Ga_{1-x}B_xAs$ is the intermediate layer and GaAs is the device containing layer), (3) Si/$Ga_{1-x}B_xAs$(graded)/GaAs, where x is a variable in the range from 0.27 to 0.002 (in this notation Si is the substrate, $Ga_{1-x}B_xAs$ is the intermediate layer and GaAs is the device containing layer); to provide a graded $Ga_{1-x}B_xAs$ layer between the Si substrate and GaAs layer, x has a large value at the top of the range in the portion of the intermediate layer adjacent the silicon substrate and a value at the bottom of the range adjacent the GaAs layer, (4) Si/($Ga_{1-x}B_xAs$/GaAs)$_n$/GaAs, where n is an integer representing the number of super-lattice cycles of the ($Ga_{1-x}B_xAs$/GaAs) layers, (5) Si/Ge/$Ga_{1-x}B_xAs$/GaAs, where x is a fixed value in the range from 0.01 to 0.05, (6) Si/$Si_{1-y}Ge_y$/$Ga_{1-x}B_xAs$/GaAs, where y is a variable from slightly more than 0 to 1 such that y is about zero for the portion of the $Si_{1-y}Ge_y$ layer abutting against the Si substrate and y is about 1 for the portion of the $Si_{1-y}Ge_y$ layer abutting against the $Ga_{1-x}B_xAs$ layer, and x is a fixed value in the range from 0.01 to 0.05.

In the foregoing examples, it is possible to replace, in each instance, $Ga_{1-x}B_xAs$ by $GaAs_{1-z}N_z$ and to have the values of z in the same range as the values of x. Where chemical vapor deposition is used to form heteroepitaxial devices, the substrates may be Si, $Si_xGe_{1-x}$(graded) (where x is a variable from one to zero), Ge or $Al_2O_3$ (i.e., sapphire). The advantages of these heteroepitaxial devices are large, low-cost substrates in the case of silicon, better lattice match for Si/$Si_xGe_{1-x}$ and Ge, and better thermal expansion match for dielectric $Al_2O_3$ substrates.

While there have been described and illustrated several specific embodiments of the invention, it will be clear that variations in the details of the embodiments specifically illustrated and described may be made without departing from the true spirit and scope of the invention as defined in the appended claims.

What is claimed:

1. In method of forming a low dislocation density layer of a III-V or II-VI semiconductor compound on a bulk semiconductor substrate, introducing into the compound alloying atoms enabling the layer to have a lower dislocation density than it would have if the alloying atoms were not so introduced, the quantity of alloying atoms being such that they are in a supersaturated state in the compound, and adding sufficient energy to the compound and alloying atoms to cause the alloying atoms to be predetermined positions in the lattice structure of the compound that provides the lower dislocation density, the amount of the added energy being such that the alloying atoms are not precipitated from the compound.

2. The method of claim 1 wherein the predetermined positions are at sites in the lattice structure corresponding with atoms of one of elements of the compound.

3. The method of claim 2 wherein the compound is formed as a layer of the substrate at the time the alloying atoms are introduced, the alloying atoms being introduced at random locations into the layer by ion beam bombardment, the alloying atoms moving from the random locations to the predetermined locations in response to the energy being added to the layer and the alloying atoms.

4. The method of claim 3 wherein the energy is added by flash annealing said layer and substrate.

5. The method of claim 3 wherein the layer is formed by applying the ion beam to the substrate with sufficient energy to cause ions of the alloying atoms to sink into the substrate and leave the top few atomic layers of the substrate without substantial qualities of said alloying atoms.

6. The method of claim 5 wherein the energy is added by flash annealing said atomic layers so all of said atomic layers have approximately the same dislocation density.

7. The method of claim 5 wherein the substrate consists of essentially GaAs and the alloying atoms consist essentially B, said top few atomic layers being flash annealed by heating them to a temperature of about 950° C. for about 25 seconds.

8. The method of claim 6 wherein the layers are annealed by photon energy.

9. The method of claim 8 wherein the photon energy is ultraviolet energy.

10. The method of claim 3 wherein the substrate consists of essentially GaAs and the alloying atoms are a single element selected from the group consisting of B and N.

11. The method of claim 2 wherein the layer is formed by simultaneously depositing on a surface on the substrate vapors of organometallic compounds of the III-V or II-VI semiconductors and the alloying atoms in said quality, the organometallic compounds chemically reacting on said surface to form the layer and an organic vapor, and removing the organic vapor.

12. The method of claim 11 wherein the energy is applied simultaneously with the vapors being deposited.

13. The method of claim 12 wherein the energy is applied by a cyclotron resonant method.

14. The method of claim 13 wherein a bias voltage is applied to the substrate causing ions of atoms of the compound and the alloy to be simultaneously incident on the substrate.

15. The method of claim 12 wherein ions of atoms of the compound and the alloy are extracted from a microwave plasma and directed at a surface of the substrate while the substrate is biased so that the extracted ions are incident on the substrate surface with sufficient energy to cause the alloy atoms to be at the predetermined locations, the energy of the incident ions being sufficiently low to preclude heating of the substrate to prevent precipitation of the alloy atoms.

16. The method of claim 12 wherein the energy is added by photon irradiating a surface of the substrate on which atoms of the compound and the alloy are indicant.

17. The method of claim 16 wherein the photons are in the ultraviolet spectrum.

18. The method of claim 17 wherein the compound atoms are Ga and As, and the alloy atoms are B.

19. The method of claim 11 wherein the alloying atoms are in compounds of a group consisting of essentially a hydrocarbon and hydrogen, atoms of one of the III-V semiconductor elements are carried in a hydrocarbon, atoms of the other III-V semiconductor element are carried in a group consisting of essentially a hydrocarbon and hydrogen.

20. The method of claim 19 where the hydrocarbons are of the alkyl family.

21. The method of claim 19 where the hydrocarbons consist of essentially $CH_3$, $C_2H_5$, $C_3H_7$ and $C_4H_9$.

22. The method of claim 11 wherein the alloying atoms and one of the III-V or II-VI semiconductor elements are carried in first and second molecules containing $CH_3$ groups and the other III-V or II-VI semiconductor element is in a third molecule containing three H atoms.

23. The method of claim 22 wherein the second and third molecules are respectively $Ga(CH_3)_3$ and $AsH_3$.

24. The method of claim 23 wherein the first molecule is selected from the group consisting essentially of $B(CH_3)_3$ and $N(CH_3)_3$.

25. The method of claim 24 wherein the mole fractions of Ga or As or N are respectively in the ranges of 0.95–0.999 and 0.05–0.0009.

26. The method of claim 11 wherein the alloying atoms are B and the first and second semiconductors are respectively Ga and As and wherein the organometallic compounds are such that

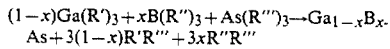

wherein R' and R'' consist of hydrocarbons and R''' is selected from the group consisting of hydrogen and a hydrocarbon.

27. The method of claim 11 wherein the alloying atoms are B and the first and second semiconductors are respectively Ga and As and wherein the organometallic compounds are such that

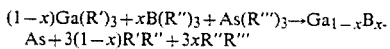

wherein R' and R'' consist of essentially $C_nH_{2n+1}$, R''' is selected from the group consisting of essentially H and $C_nH_{2n+1}$, and n is an integer.

28. The method of claim 27 where n is less than 5.

29. The method of claim 11 wherein the alloying atoms are N and the first and second semiconductors are respectively Ga and As and wherein the organometallic compounds are such that

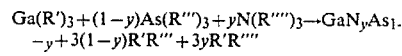

where R' consists of a hydrocarbon, R''' is selected from the group consisting of essentially hydrogen and a hydrocarbon, and R'''' is selected from the group consisting of essentially hydrogen and hydrocarbon.

30. The method of claim 11 wherein the alloying atoms are N and the first and second semiconductors are respectively Ga and As and wherein the organometallic compounds are such that

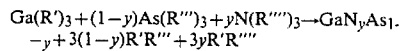

where R' consists of essentially $C_nH_{2n+1}$, R''' is selected from the group consisting of essentially H and $C_nH_{2n+1}$ R'''' is selected from the group consisting of essentially H and $C_nH_{2n+a}$ and n is an integer.

31. The method of claim 30 where n is less than 5.

32. A method of forming a semiconductor structure comprising the steps of depositing a Ge semiconductor layer on a Si semiconductor substrate, depositing vapors of $Ga(CH_3)_3$, $B(CH_3)_3$ and $AsCH_3$ on the Ge layer at low pressure to cause $Ga_{1-x}B_xAs$ layer to be formed on the Ge layer by a chemical reaction of the vapor compounds, where $0.0009 < x < 0.3$ so B is supersaturated in the GaAs, adding energy to atoms of the vapor compounds so the atoms are mobilized to cause the B atoms to occupy sites in the resulting GaAs lattice structure corresponding with the Ga atoms, the amount of added energy being sufficiently low to preclude heating of previously deposited underlying $Ga_{1-x}B_xAs$ atomic layers, the Ge layer and the substrate to prevent B precipitation.

33. The method of claim 32 wherein the added energy ionizes molecules of $Ga(CH_3)_3$, $B(CH_3)_3$ and $AsH_3$, the ionized molecules having energies between 50 and 300 eV.

34. The method of claim 32 wherein $0.01 < x < 0.05$.

35. The method of claim 32 wherein methane is formed by the chemical reaction, and removing the methane from a reaction chamber where the reaction is occurring.

36. The method of claim 32 further including forming a GaAs epitaxial layer on the $Ga_{1-x}B_xAs$ layer.

37. The method of claim 36 wherein the GaAs layer is formed in a low pressure reaction chamber by chemically reacting at least partially ionized vapors of $Ga(CH_3)_3$ and $AsH_3$.

38. The method of claim 37 further including forming a superlattice structure of alternate $Ga_{1-x}B_xAs$ and GaAs layers on the GaAs layer by ion assisted deposition processes.

39. The method of claim 32 wherein the Ge layer is formed as a graded $Si_yGe_{1-y}$ layer, where y varies from slightly more than 0 to 1 such that the value of $y \approx 1$ is in the vicinity of the substrate and the value of $y \approx 0$ is in the vicinity of the $Ga_{1-x}B_xAs$ layer.

40. A method of forming a semiconductor structure comprising the steps of depositing vapors of first, second and third organometallic compounds on a surface on a semiconductor substrate, the compounds being such that they chemically react on the surface to form a semiconductor layer consisting of a III-V or II-VI compound alloyed by the metal of the third compound, the layer compound being of the form $Q_{1-x}R_xT$, where $R_x$ is the alloying metal of the third compound, $Q_x$ is the metal of the first compound, T is the metal of the second compound, Q and R are in the same column of the periodic chart, the value of x being such that R is supersaturated in the compound, and R is a metal that substantially reduces the dislocation density of a semiconductor layer of QT on the surface, adding energy to atoms of the vapor compounds so the atoms are mobilized to cause the R atoms to occupy sites in the resulting QT lattice structure corresponding with the Q atoms, the amount of added energy being sufficiently low to preclude heating of previously deposited underlying $Q_{1-x}R_xT$ atomic layers, and the substrate to prevent R precipitation.

41. The method of claim 40 wherein the added energy ionizes molecules of the first, second and third organometallic compounds to energies causing the R atoms to be at the sites corresponding with the Q atoms.

42. The method of claim 41 wherein $0.01 < x < 0.05$.

43. The method of claim 41 wherein an organic vapor is formed by the chemical reaction, and removing the organic vapor from a reaction chamber where the reaction is occurring.

44. The method of claim 40 further including forming a QT epitaxial layer on the $Q_{1-x}R_xT$ layer.

45. The method of claim 44 wherein the QT layer is formed in a low pressure reaction chamber by chemically reacting at least partially ionized vapors of the first and second organometallic compounds.

46. The method of claim 45 further including forming a superlattice structure of alternate $Q_{1-x}R_xT$ and QT layers on the QT layer by ion assisted deposition processes.

47. The method of claim 40 further including the step of forming another semiconductor layer on the substrate, the $Q_{1-x}R_xT$ layer being formed on the another layer, the another semiconductor layer providing an approximate lattice match between the substrate and the $Q_{1-x}R_xT$ layer, the added energy being insufficient to preclude heating the another layer to prevent R precipitation.

48. The method of claim 47 wherein the another layer is formed as a graded $A_yZ_{1-y}$ layer, where A is a metal having a lattice constant approximating that of the substrate, Z is a metal having a lattice constant approximating that of the $Q_{1-x}R_xT$ layer, y varies from slightly more than 0 to 1 such that the value of $y \approx 1$ is in the vicinity of the substrate and the value of $y \approx 0$ is in the vicinity of the $Q_{1-x}R_xT$ layer.

49. A method of forming a semiconductor layer consisting essentially of a III-V or II-VI semiconductor compound alloyed with alloying atoms in a quantity to cause the dislocation density of the layer of the III-V or II-VI semiconductor compound to be substantially reduced relative to the dislocation density of a layer of the III-V or II-VI semiconductor compound without the alloying atoms, the layer being formed on a non-metal substrate, comprising the steps of simultaneously depositing on a surface on the substrate vapors of organometallic compounds of the III-V or II-VI semiconductors and the alloying atoms in a quantity to reduce the dislocation density of a crystal formed of the III-V or II-VI semiconductors on the surface, the organometallic compounds chemically reacting on said surface to form the low dislocation density layer and an organic vapor, the alloying atoms and one of the III-V or II-VI semiconductor elements being carried in first and second molecules containing $CH_3$ groups and the other III-V or II-VI semiconductor element being in a third molecule containing three H atoms, the alloying atoms being deposited on the surface in sufficient quantity to be supersaturated in the III-V or II-VI compound, adding energy to the vapors as the vapors are being deposited on the surface, the added energy being of sufficient level to cause the alloying atoms to be at sites in a lattice structure of the III-V or II-VI semiconductor compound causing the substantial reduction of dislocation density of the III-V or II-VI semiconductor compound relative to the dislocation density of the III-V or II-VI semiconductor compound without the alloying atoms, without causing precipitation of said alloying atoms, and removing the organic vapor.

50. The method of claim 49 wherein the mole fractions of Ga or As and B or N are respectively in the ranges of 0.95–0.99 and 0.05–0.01.

51. The method of claim 49 wherein the energy is added by depositing at least some of the first, second and third organometallic compounds as ions on the surface.

52. The method of claim 49 wherein the alloying atoms are carried in a group consisting of essentially a hydrocarbon and hydrogen, atoms of one of the III-V semiconductor elements are carried in a hydrocarbon, atoms of the other III-V semiconductor element are carried in a group consisting of essentially a hydrocarbon and hydrogen.

53. The method of claim 52 where the hydrocarbons are of the alkyl family.

54. The method of claim 52 where the hydrocarbons consist of essentially $CH_3$, $C_2H_5$, $C_3H_7$ and $C_4H_9$.

55. The method of claim 49 wherein the second and third molecules are respectively $Ga(CH_3)_3$ and $AsH_3$.

56. The method of claim 58 wherein the first molecule is selected from the group consisting essentially of $B(CH_3)_3$ and $N(CH_3)_3$.

57. The method of claim 56 wherein the mole fractions of Ga or As and B or N are respectively in the ranges of 0.95–0.999 and 0.05–0.0009.

58. The method of claim 49 wherein the energy is added by topically irradiating the surface.

59. The method of claim 58 wherein the second and third molecules are respectively $Ga(CH_3)_3$ and $AsH_3$.

60. The method of claim 59 wherein the first molecule is selected from the group consisting essentially of $B(CH_3)_3$ and $N(CH_3)_3$.

61. The method of claim 51 wherein the ions are derived by a cyclotron resonance process.

62. The method of claim 51 wherein the ions are extracted from a plasma.

63. The method of claim 51 wherein the surface is topically irradiated by photons.

64. The method of claim 63 wherein the photons are in an ultraviolet beam.

65. The method of claim 64 wherein the vapors are molecules of $Ga(CH_3)_3$, $B(CH_3)_3$ and $AsH_3$.

66. The method of claim 49 wherein the alloying atoms are B and the first and second semiconductors are respectively Ga and As and wherein the organometallic compounds are such that $$(1-x)Ga(R')_3 + xB(R'')_3 + As(R''')_3 \rightarrow$$
$$Ga_{1-x}B_xAs + 3(1-x)R'R''' + 3xR''R'''$$

where R' and R'' consist of hydrocarbons and R''' is selected from the group consisting of hydrogen and a hydrocarbon.

67. The method of claim 49 wherein the alloying atoms are B and the first and second semiconductors are respectively Ga and As and wherein the organometallic compounds are such that $$(1-x)Ga(R')_3 + xB(R'')_3 + As(R''')_3 \rightarrow Ga_{1-x}B_xAs + 3(1-x)R'R''' + 3xR''R'''$$

where R' and R'' consist of essentially $C_nH_{2n+1}$, R''' is selected from the group consisting of essentially H and $C_nH_{2n+1}$, and n is an integer.

68. The method of claim 67 where n is less than 5.

69. The method of claim 49 wherein the alloying atoms are N and the first and second semiconductors are respectively Ga and As and wherein the organometallic compounds are such that $$Ga(R')_3 + (1-y)As(R''')_3 + yN(R'''')_3 \rightarrow GaN_yAs_{1-y} + 3(1-y)R'R''' + 3yR'R''''$$

where R' consists of a hydrocarbon, R''' is selected from the group consisting of essentially hydrogen and a hydrocarbon, and R'''' is selected from the group consisting of essentially hydrogen and a hydrocarbon.

70. The method of claim 49 wherein the alloying atoms are N and the first and second semiconductors are respectively Ga and As and wherein the organometallic compounds are such that $$Ga(R')_3 + (1-y)As(R''')_3 + yN(R'''')_3 \rightarrow GaN_yAs_{1-y} + 3(1-y)R'R''' + 3yR'R''''$$

where R' consists of essentially $C_nH_{2n+1}$, R''' is selected from the group consisting of essentially H and $C_nH_{2n+1}$, R'''' is selected from the group consisting of essentially H and $C_nH_{2n+1}$ and n is an integer.

71. The method of claim 70 where n is less than 5.

* * * * *

UNITED STATES PATENT AND TRADEMARK OFFICE
CERTIFICATE OF CORRECTION

PATENT NO. : 4,916,088
DATED : April 10, 1990
INVENTOR(S) : John B. Mooney et al It is certified that error appears in the above-indentified patent and that said Letters Patent is hereby corrected as shown below:

In the Drawings, in Figure 3, change "$AsCH_3$" to --$AsH_3$-- (both occurrences)

Signed and Sealed this

Eleventh Day of April, 1995

*Attest:*

BRUCE LEHMAN

*Attesting Officer*  *Commissioner of Patents and Trademarks*